NOVEL METHOD OF MANUFACTURING PROTECIVE OXIDE FILMS, AND STRUCTURES EMBODYING SUCH FILMS

Filed Dec. 29, 1970

United States Patent Office 3,737,341

Patented June 5, 1973

3,737,341

NOVEL METHOD OF MANUFACTURING PROTECTIVE OXIDE FILMS, AND STRUCTURES EMBODYING SUCH FILMS

Michel Croset and Noel Nouailles, Paris, France, assignors to SESCOSEM-Societe Europeenne des Semiconducteurs et de Microelectronique Filed Dec. 29, 1970, Ser. No. 102,382
Claims priority, application France, Jan. 7, 1970, 7000385
Int. Cl. C23f *1/02, 7/02*
U.S. Cl. 117—212 4 Claims

ABSTRACT OF THE DISCLOSURE

The invention relates to a method of depositing a dielectric film of predetermined shape, upon a semiconductor substrate.

A tantalum film 2 is deposited upon the substrate 1. A mask 3 is deposited upon the assembly, and an oxidising process carried out. The zones 4, exposed by the mask, are oxidised and convert to tantalum oxide. The mask and the tantalum which remains, are then eliminated.

In certain cases, it is necessary to cover certain zones of the surface of a semiconductor substrate structure, with protective metal oxide films having high resistance to chemical agents.

Generally speaking, the surface to be protected is uniformly covered by an oxide film. The cutting of this film, that is to say the laying bare of the surface being protected of certain zones, is effected by using photoengraving techniques across a protective mask.

It will be obvious that, if the oxide film has a high resistance to chemical attack, this cutting operation is difficult to carry out.

Those skilled in the art will be aware too, that the results cannot be reproduced with a great accuracy.

The object of the present invention is a process of depositing a metal oxide film on a substrate and its cutting in accordance with a predetermined pattern with a high degree of accuracy.

The method of the invention is characterized by the following steps:

(a) Depositing upon the surface to be protected, a film of a readily oxidizable metal material whose oxide has a high resistance to chemical agents;

(b) Depositing upon said film a mask of a material which is not readily oxidizable, said mask laying bare those parts of the surface where the protective layer is to be formed;

(c) Oxidizing heat treatment following which those parts of said metal layer which are exposed by the mask convert to an oxide of said metal;

(d) Removal of the remaining part of said film.

The invention is better understood from a consideration of the ensuing description with reference to the attached drawings in which FIGS. 1 to 6 illustrate in transverse section an element covered with a dielectric film, during the various steps of its manufacture by the method according to the present invention.

Figure 1:
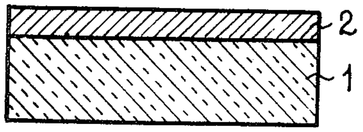

In FIG. 1, a substrate 1 of silicon for example, has been covered, i.e. by vaporisation under vacuo with a film 2 of readily oxidizable material whose oxide is highly resistant to chemical agents.

Tantalum can be readily used. Tantalum oxide $Ta_2O_5$ is particularly resistant to chemical agents.

Figure 2:
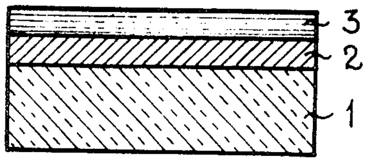
Figure 3:
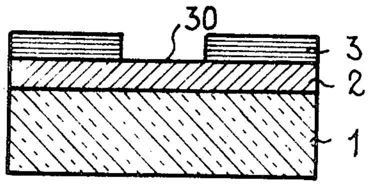

In FIG. 2, a layer 3 of a material, which is not readily oxidizable, has been deposited upon the film 2. A mask of aluminium is obtained by conventional chemical etching of an earlier aluminium deposit. A zone 30 of the tantalum film is now exposed. (FIG. 3).

Figure 4:
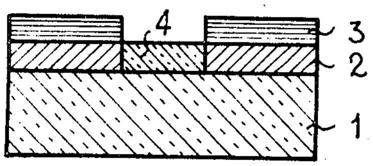

FIG. 4 shows the assembly after it has been subjected to an oxidizing process. This process, in the case of tantalum consists in raising the assembly to a temperature of 500° C. in an oxygen atmosphere. In the zone 30, the tantalum is oxidised. A film 4 of tantalum oxide is formed. The tantalum is left behind at the locations protected by the mask .

Figure 5:
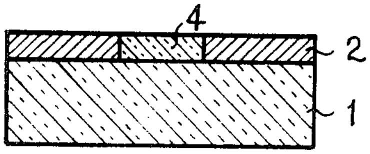

In FIG. 5, the mask has been removed. Depending upon the location considered, there is left behind on the substrate either exclusively the tantalum layer 2 or exclusively the tantalum oxide layer 4.

Figure 6:
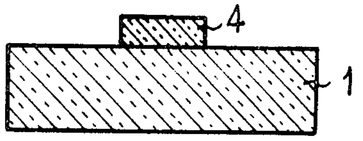

In FIG. 6 the tantalum has been removed by acid etching. All that is left upon the structure is the tantalum oxide film, this acid etching having no effect upon the tantalum oxide.

The method of the invention makes it possible to deposit dielectric films of predetermined shape, with a high degree of accuracy.

It goes without saying that the material which is not readily oxidizable and makes up the mask, need not necessarily be a metal. It may for example be a dielectric resistant to the oxidizing operation.

What we claim is:

1. A process for the deposition of a protective tantalum oxide layer having a predetermined shape on a semiconductor substrate comprising the steps of:

(a) depositing on the semiconductor substrate to be protected a film of tantalum;

(b) depositing on the tantalum film a mask of material resistant to thermal treatment, said mask deposited in a predetermined shape and exposing at least some parts of the tantalum film where the protective tantalum oxide layer is to be formed;

(c) oxidizing the thus-masked substrate by thermal treatment thereby converting the exposed portions of the tantalum layer to tantalum oxide; and (d) chemically etching the assembly and removing the remaining portions of the tantalum film.

2. A process as claimed in claim 1, wherein said metal is tantalum, the substrate being a silicon chip, the thermal treatment comprising heating the assembly to a temperature of 500° C. in an oxygen atmosphere.

3. A process as claimed in claim 2, wherein the mask is made of aluminum.

4. A process as claimed in claim 1, wherein the thermal treatment of step (c) comprises heating the assembly to a temperature of about 500° C. in an oxygen atmosphere.

References Cited

UNITED STATES PATENTS

| | | | |
|---|---|---|---|
| 3,607,679 | 5/1969 | Melroy et al. | 117—212 X |
| 3,485,665 | 12/1969 | Angelo et al. | 156—17 X |
| 3,591,465 | 7/1971 | McKelrey | 156—17 X |
| 3,386,894 | 6/1968 | Steppat | 117—212 X |
| 3,237,271 | 3/1966 | Arnold et al. | 117—212 |
| 3,169,892 | 2/1965 | Lemdsar | 117—217 X |

RALPH S. KENDALL, Primary Examiner

U.S. Cl. X.R.

117—217; 156—17